United States Patent
Reid et al.

(10) Patent No.: US 6,650,156 B1
(45) Date of Patent: Nov. 18, 2003

(54) INTEGRATED CIRCUIT CHARGE PUMPS HAVING CONTROL CIRCUITS THEREIN THAT INHIBIT PARASITIC CHARGE INJECTION FROM CONTROL SIGNALS

(75) Inventors: David Reid, Forestville (AU); Timothy Gillespie, Beverly Hills (AU)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/232,203

(22) Filed: Aug. 29, 2002

(51) Int. Cl.[7] ............................................. H03L 7/06
(52) U.S. Cl. ..................... 327/157; 327/158; 327/159
(58) Field of Search ............................ 327/148, 157, 327/158, 159, 536, 537, 112, 161; 326/87; 363/59, 60

(56) References Cited

U.S. PATENT DOCUMENTS

| | | | |
|---|---|---|---|
| 4,782,250 A | 11/1988 | Adams et al. ............... 307/473 |
| 5,451,889 A | 9/1995 | Heim et al. .................... 326/81 |
| 5,467,031 A | 11/1995 | Nguyen et al. ............... 326/81 |
| 5,602,496 A | 2/1997 | Mahmood ..................... 326/71 |
| 5,670,905 A | 9/1997 | Keeth et al. ................. 327/333 |
| 5,793,592 A | 8/1998 | Adams et al. ............... 361/90 |
| 5,834,948 A | 11/1998 | Yoshizaki et al. ............ 326/81 |
| 5,892,371 A | 4/1999 | Maley ........................... 326/81 |
| 6,031,394 A | 2/2000 | Cranford, Jr. ................. 326/80 |
| 6,057,710 A | 5/2000 | Singh ............................ 326/80 |
| 6,064,227 A | 5/2000 | Saito ............................. 326/80 |
| 6,081,132 A | 6/2000 | Isbara .......................... 326/81 |
| 6,124,741 A | 9/2000 | Arcus .......................... 327/112 |
| 6,222,895 B1 | 4/2001 | Larsson ....................... 375/376 |
| 6,316,977 B1 * | 11/2001 | Sargeant ..................... 327/157 |
| 6,420,914 B1 * | 7/2002 | Hasegawa ................... 327/112 |
| 6,509,770 B2 * | 1/2003 | Gossmann et al. .......... 327/157 |
| 6,529,082 B1 * | 3/2003 | Boerstler et al. ............. 331/17 |
| 2001/0052806 A1 | 12/2001 | Gu et al. ...................... 327/157 |

OTHER PUBLICATIONS

Dhong et al., "A low–noise TTL–compatible CMOS off––chip driver," IBM J. Res. Develop., vol. 39, No. 1/2, Jan./Mar. 1995.
Bernstein et al., "High Speed CMOS Design Styles," Chapter 6, 1998, pp. 207–246.
Drawings entitled "Current Source," Admitted Prior Art, 1 page, undated.

* cited by examiner

Primary Examiner—Tuan T. Lam
Assistant Examiner—Hiep Nguyen
(74) Attorney, Agent, or Firm—Myers Bigel Sibley & Sajovec

(57) ABSTRACT

Integrated circuit charge pumps reduce parasitic charge injection from signals that drive control inputs of the charge pumps. This reduction in parasitic charge injection can be utilized to lower phase error when the charge pumps are used in phase-locked loops (PLLs). A charge pump may include an output current source and a control circuit that drives the output current source with control signals in a preferred manner. The output current source may include a totem pole driver therein. This totem pole driver includes at least an upper PMOS supply transistor and a lower PMOS current source transistor that are disposed in series in a pull-up path extending between an output of the driver and a power supply line (e.g., Vdd). The control circuit may include a pull-up control circuit that is configured to drive a gate of the upper PMOS supply transistor with a PMOS turn-on voltage in response to a leading edge of a pull-up control signal.

32 Claims, 3 Drawing Sheets

US 6,650,156 B1

INTEGRATED CIRCUIT CHARGE PUMPS HAVING CONTROL CIRCUITS THEREIN THAT INHIBIT PARASITIC CHARGE INJECTION FROM CONTROL SIGNALS

FIELD OF THE INVENTION

The present invention relates to integrated circuit devices and, more particularly, to integrated circuit driver devices and charge pumps.

BACKGROUND OF THE INVENTION

Phase-locked loop (PLL) circuits are frequently used to generate highly accurate internal clock signals on an integrated circuit substrate. Typical PLL circuits include charge pumps that selectively source current to and sink current from a loop filter which controls an oscillator stage of the PLL circuit. This oscillator stage may be a voltage-controlled oscillator (VCO) stage. The amount of charge (Q) provided by the sourcing or sinking currents may be proportional to the duration of an active period of a control signal provided to the charge pump.

One example of a conventional charge pump that may be used in a PLL circuit is described in U.S. Pat. No. 6,124,741 to Arcus. In particular, FIGS. 3–6 and 9 of the '741 patent illustrate various charge pumps that include current sources defined by a plurality of MOS transistors. These MOS transistor are arranged as a totem pole of upper PMOS and lower NMOS transistors that are connected in series (source-to-drain) between a power supply line (Vdd) and a ground reference line (Vss).

Control circuitry is also provided to drive the MOS transistors in a manner that matches the up/down current pumping by reducing Vds variations. PLL circuits are also described in U.S. Pat. No. 6,222,895 to Larsson and in published U.S. application Ser. No. 2001/0052806 A1 to Gu et al. U.S. Pat. No. 6,388,499 to Tien et al., assigned to the present assignee, also discloses a totem pole arrangement of MOS transistors that can be used in a signal driver.

SUMMARY OF THE INVENTION

Integrated circuit charge pumps according to embodiments of the present invention reduce parasitic charge injection from signals that drive control inputs of the charge pumps. This reduction in parasitic charge injection can be utilized to lower phase error when the charge pumps are used in phase-locked loops (PLLs). In some embodiments, an integrated circuit charge pump includes an output current source and a control circuit that drives the output current source with control signals in a preferred manner. The output current source may include a totem pole driver therein. This totem pole driver includes at least an upper PMOS supply transistor and a lower PMOS current source transistor that are disposed in series in a pull-up path extending between an output of the driver and a power supply line (e.g., Vdd). The totem pole driver also includes at least an upper NMOS current source transistor and a lower NMOS supply transistor. These NMOS transistors are disposed in series in a pull-down path extending between the output of the device and a reference line (e.g., Vss). The control circuit may include a pull-up control circuit and a pull-down control circuit. The pull-up control circuit is configured to drive a gate of the upper PMOS supply transistor with a PMOS turn-on voltage in response to a leading edge of a pull-up control signal. The pull-up control circuit is further configured to simultaneously drive a gate of the upper PMOS supply transistor with a PMOS turn-off voltage and a source of the lower PMOS current source transistor with a first non-zero turn-off reference voltage (e.g., PVT), in response to a trailing edge of the pull-up control signal.

In some additional embodiments, the pull-up control circuit includes a first output that is electrically coupled to the gate of the upper PMOS supply transistor and a second output that is electrically coupled to a source of the lower PMOS current source transistor. This second output of the pull-up control circuit is preferably disposed in a high-impedance state in response to the leading edge of the pull-up control signal. In the event the pull-up path includes only two PMOS transistors, then the second output of the pull-up control circuit may be electrically coupled to a source of the lower PMOS current source transistor and a drain of the upper PMOS supply transistor. A gate of the lower PMOS current source transistor may also be held at a first bias voltage (e.g., VP1).

The pull-down control circuit is preferably configured to drive a gate of the lower NMOS supply transistor with an NMOS turn-on voltage in response to a leading edge of a pull-down control signal. The pull-down control circuit is further configured to simultaneously drive a gate of the lower NMOS supply transistor with an NMOS turn-off voltage and a source of the upper NMOS current source transistor with a second turn-off reference voltage (e.g., NVT<Vdd) in response to a trailing edge of the pull-down control signal. Moreover, the pull-down control circuit may include a first output that is electrically coupled to the gate of the lower NMOS supply transistor and a second output that is electrically coupled to a source of the upper NMOS current source transistor. This second output of the pull-down control circuit is preferably disposed in a high-impedance state in response to the leading edge of the pull-down control signal. In the event the pull-down path includes only two NMOS transistors, then the second output may also be electrically coupled to a drain of the lower NMOS supply transistor. A gate of the upper NMOS current source transistor may also be held at a second bias voltage (e.g., VN1).

According to preferred aspects of these embodiments of the present invention, the pull-up control circuit includes a PMOS access transistor. This PMOS access transistor has a first current carrying terminal (e.g., source) that is electrically coupled to the source of the lower PMOS current source transistor and a second current carrying terminal (e.g., drain) that is held at the first turn-off reference voltage. The PMOS access transistor is preferably sized to match the upper PMOS supply transistor in width and length, to reduce switching noise and charge injection caused by capacitive coupling in the pull-up path. The pull-down control circuit also includes an NMOS access transistor. This NMOS access transistor has a first current carrying terminal (e.g., drain) electrically coupled to the source of the upper NMOS current source transistor and a second current carrying terminal (e.g., source) that is held at the second turn-off reference voltage. The NMOS access transistor is preferably sized to match the lower NMOS supply transistor in width and length, to reduce switching noise and charge injection caused by capacitive coupling in the pull-down path.

According to still further preferred aspects of these embodiments, the pull-up control circuit is configured to include first and second delay-balanced inverter strings that drive the gate of the upper PMOS supply transistor and a gate of the PMOS access transistor, respectively, in response to the pull-up control signal. These delay-balanced inverter strings may include an uneven number of inverters, with one or more delay elements providing an equivalent inverter delay. The pull-down control circuit is also configured to include a pair of delay-balanced inverter strings that drive the gate of the lower NMOS supply transistor and a gate of the NMOS access transistor in response to the pull-down control signal.

DESCRIPTION OF PREFERRED EMBODIMENTS

Figure 1:
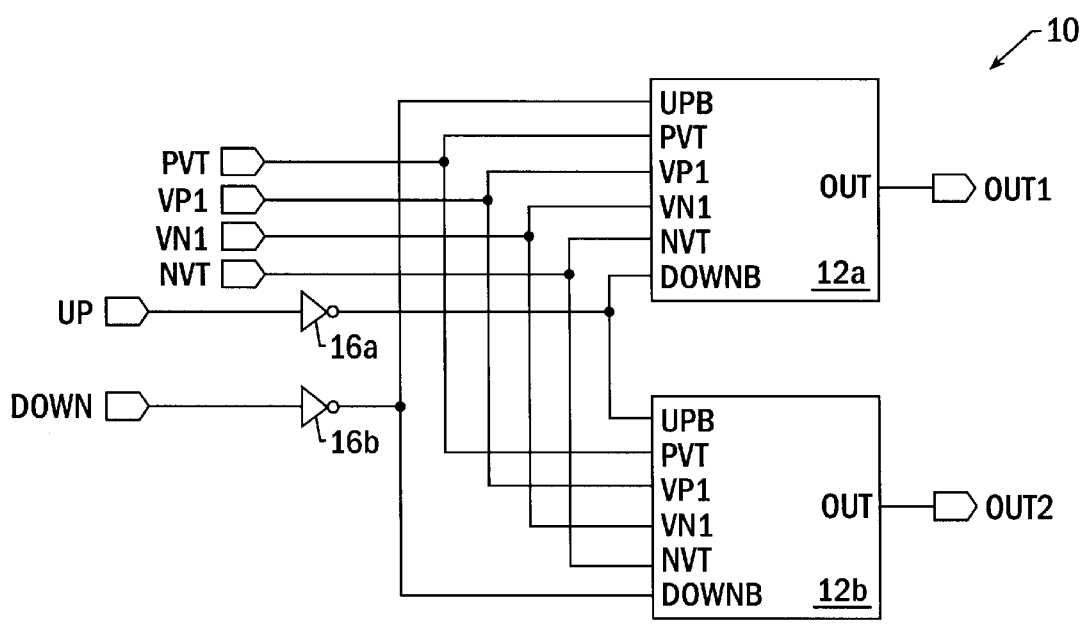
FIG. 1 is a block diagram of a differential charge pump according to an embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Referring now to FIG. 1, a differential charge pump 10 according to an embodiment of the present invention includes a pair of charge pumps 12a and 12b that generate a pair of complementary output signals OUT1 and OUT2 in response to a pair of primary control signals UP and DOWN and a plurality of reference signals, shown as PVT, VP1, VN1 and NVT, which may be fixed-voltage reference signals. As described more fully hereinbelow, the reference signal PVT may be set to a first turn-off reference voltage and the reference signal NVT may be set to a second turn-off reference voltage. The reference signal VP1 may be set to a first bias voltage and the reference signal VN1 may be set to a second bias voltage.

The primary control signals UP and DOWN are illustrated as active high signals that are provided to a pair of inverters 16a and 16b. The primary control signals UP and DOWN may be made active during non-overlapping time intervals. Alternatively, to prevent dead-band conditions when a phase error in a PLL is small, the primary control signals UP and DOWN may be made to overlap. As explained more fully hereinbelow with respect to FIG. 2, when the primary control signal UP is switched to an active high level, the input DOWNB of the first charge pump 12a and the input UPB of the second charge pump 12b are switched to active low levels. At these active low levels, the first charge pump 12a sinks current from the first output signal line OUT1 and the second charge pump 12b sources current to the second output signal line OUT2. The duration of the active period of the primary control signal UP controls the amount of "sinking" charge ($Q_{down1}$) received by the first charge pump 12a from the first output signal line OUT1 and the amount of "sourcing" charge ($Q_{up2}$) supplied by the second charge pump 12b to the second output signal line OUT2. The pull-down path of the first charge pump 12a and the pull-up path of the second charge pump 12b may be matched so that the magnitude of the sinking charge equals the magnitude of the sourcing charge (i.e., $Q_{down1}=Q_{up2}$).

Similarly, when the primary control signal DOWN is switched to an active high level, the input DOWNB of the second charge pump 12b and the input UPB of the first charge pump 12b are switched to active low levels. At these active low levels, the second charge pump 12b sinks current from the second output signal line OUT2 and the first charge pump 12a sources current to the first output signal line OUT1. The duration of the active period of the primary control signal DOWN controls the amount of "sinking" charge ($Q_{down2}$) received by the second charge pump 12b and the amount of "sourcing" charge ($Q_{up1}$) supplied by the first charge pump 12a. The pull-up path of the first charge pump 12a and the pull-down path of the second charge pump 12b may be matched so that the magnitude of the sinking charge equals the magnitude of the sourcing charge (i.e., $Q_{down2}=Q_{up1}$).

Figure 2:
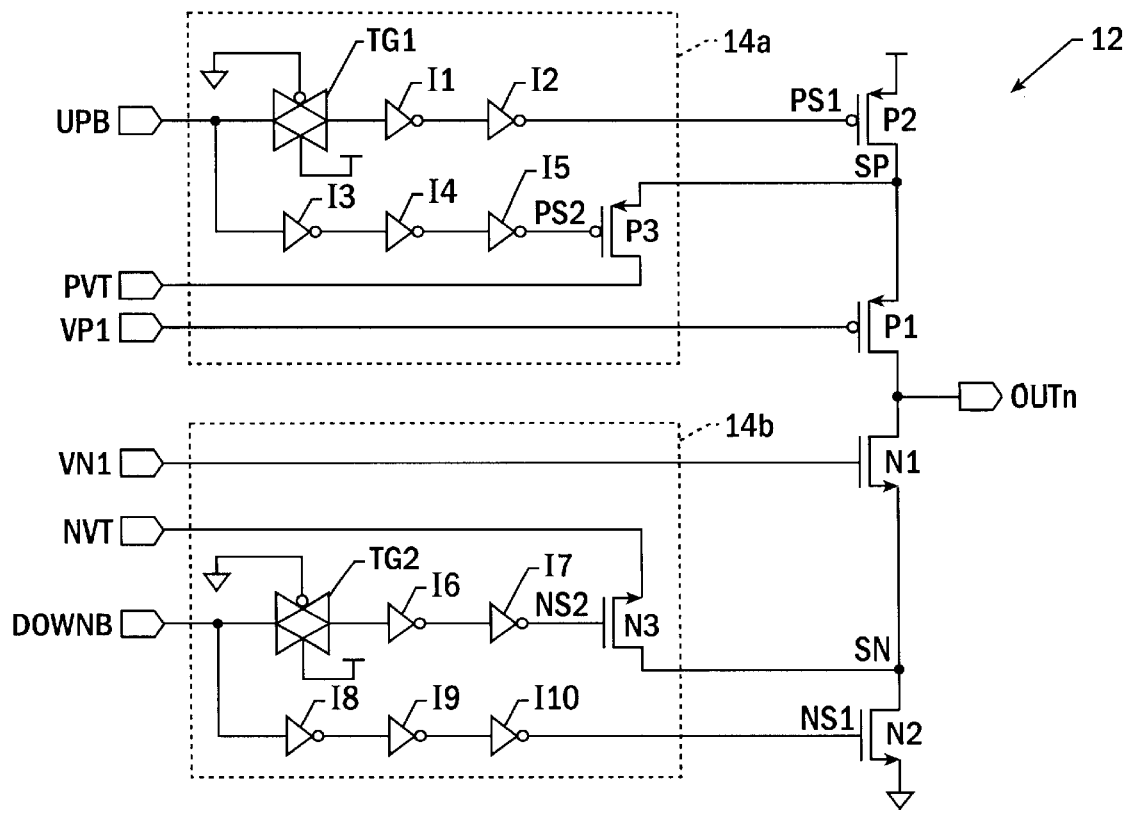
FIG. 2 is an electrical schematic of a charge pump according to another embodiment of the present invention.

The charge pump 12 of FIG. 2 includes a pull-up control circuit 14a that is responsive to an active low pull-up control signal UPB and a pull-down control circuit 14b that is responsive to an active low pull-down control signal DOWNB. The pull-up control circuit 14a also receives reference signal PVT, which is held at a first turn-off reference voltage, and reference signal VP1, which is held at a first bias voltage. The pull-down control circuit 14b also receives reference signal NVT, which is held at a second turn-off reference voltage, and reference signal VN1, which is held at a second bias voltage. Typical |NVT| and |PVT| values are 900 mV with respect to the source voltage of the corresponding supply FET and typical |VN1| and |VP1| values are 800 mV with respect to the source voltage of the corresponding supply FET. Thus, for a power supply voltage (Vdd) of 2.5 Volts, the first turn-off reference voltage (PVT) may be set to about 1.6 Volts and the first bias voltage (VP1) may be set to about 1.7 Volts. Likewise, the second turn-off reference voltage (NVT) may be set to about 0.9 Volts and the second bias voltage (VN1) may be set to about 0.8 Volts.

The charge pump 12 also includes an output current source. This output current source is illustrated as including a totem pole driver. This driver is illustrated as including a plurality of PMOS pull-up transistors and a plurality of NMOS pull-down transistors. In some embodiments, two PMOS pull-up transistors are provided in a pull-up path and two NMOS pull-down transistors are provided in a pull-down path. A greater number of transistors may also be provided in each pull-up and pull-down path. The pull-up path extends between an output OUTn of the driver and a power supply line (Vdd) and the pull-down path extends between the output OUTn and a reference line (Vss). The PMOS transistors include at least an upper PMOS supply transistor P2 and a lower PMOS current source transistor P1. The NMOS transistors include at least an upper NMOS current source transistor N1 and a lower NMOS supply transistor N2.

According to a preferred aspect of the charge pump 12, the pull-up control circuit 14a is configured to drive a gate of the upper PMOS supply transistor P2 with a PMOS turn-on voltage (i.e., logic 0 voltage), in response to a leading edge (e.g., falling edge) of the pull-up control signal UPB. The pull-up control circuit 14a is also configured to simultaneously drive a gate of the upper PMOS supply transistor P2 with a PMOS turn-off voltage (i.e., logic 1 voltage) and a source of the lower PMOS current source transistor P1 with the first turn-off reference voltage PVT in response to a trailing edge (e.g., rising edge) of the pull-up control signal UPB. The pull-up control circuit 14a includes a first output that is electrically coupled to the gate of the upper PMOS supply transistor P2 by signal line PS1. The pull-up control circuit 14a also includes a second output that is electrically coupled to a source of the lower PMOS current source P1 and a drain of the upper PMOS supply transistor P2 by signal line SP.

The pull-up control circuit 14a may also include a PMOS access transistor P3 having one current carrying terminal (e.g, source) that is connected to the signal line SP and another current carrying terminal (e.g., drain) that receives the first turn-off reference voltage PVT. The pull-up control circuit 14a includes first and second delay-balanced inverter strings that are configured to drive the gate of the upper PMOS supply transistor P2 at signal line PS1 and a gate of the PMOS access transistor P3 at signal line PS2, respectively, in response to the pull-up control signal UPB. The first inverter string is illustrated as including a normally-on transmission gate TG1 and inverters I1 and I2. The second inverter string is illustrated as including an odd number of inverters I3, I4 and I5. The transmission gate TG1 and the inverters I1–I5 are configured to provide equivalent signal delays. Accordingly, a leading edge of the active low pull-up control signal UPB (i.e., high-to-low edge) will simultaneously cause the upper PMOS supply transistor P2 to turn on and the PMOS access transistor P3 to turn off and thereby isolate the source of the lower PMOS current source P1 from the first turn-off reference voltage PVT.

According to a preferred aspect of the pull-up control circuit 14a, the PMOS access transistor P3 matches the upper PMOS supply transistor P2 in width and length. In some embodiments, this matching between the PMOS transistors P2 and P3 may be present in those situations where the leading and trailing edges of the complementary output signals generated on signal lines PS1 and PS2 are matched and a finite source-to-well voltage of the PMOS access transistor P3 can be ignored. The matching of the PMOS transistors P2 and P3 may also be present in other situations.

This matching of the sizes of the PMOS transistors P2 and P3 causes the gate-to-source capacitance of the PMOS access transistor P3 to match the gate-to-drain capacitance of the upper PMOS supply transistor P2. In this manner, the capacitive couplings between signal lines PS1 and SP and between signal lines PS2 and SP (and the source of the lower PMOS current source transistor P1) automatically cancel each other when the signal lines PS1 and PS2 are simultaneously switched to opposite logic levels by the first and second delay-balanced inverter strings. This cancellation of the capacitive coupling to the source terminal of the lower PMOS current source transistor P1 operates to minimize the signal swing at this source terminal when the pull-up path is switched on and off and thereby inhibit charge injection from the pull-up control signal UPB to the source of the lower PMOS current source transistor P1. In addition, the magnitude of the first turn-off reference voltage PVT can be carefully controlled to optimize pull-up performance. However, in alternative embodiments, the PMOS access transistor P3 and the PMOS supply transistor P2 may not match each other in size. Such intentional mismatch may be advantageous to optimize performance for a particular fabrication process, for example.

The pull-down control circuit 14b is configured to drive a gate of the lower NMOS supply transistor N2 with an NMOS turn-on voltage (e.g., logic 1 voltage), in response to a leading edge of the pull-down control signal DOWNB. The pull-down control circuit 14b is also configured to simultaneously drive a gate of the lower NMOS supply transistor N2 with an NMOS turn-off voltage and a source of the upper NMOS current source transistor N1 with the second turn-off reference voltage NVT in response to a trailing edge of the pull-down control signal DOWNB. The pull-down control circuit 14b includes a first output that is electrically coupled to the gate of the lower NMOS supply transistor N2 by signal line NS1. The pull-down control circuit 14b also includes a second output that is electrically coupled to a source of the upper NMOS current source N1 and a drain of the lower NMOS supply transistor N2 by signal line SN.

The pull-down control circuit 14b also includes an NMOS access transistor N3 that may, in some embodiments, match the lower NMOS supply transistor N2 in width and length, as described above. The pull-down control circuit 14b includes first and second delay-balanced inverter strings that are configured to drive the gate of the lower NMOS supply transistor N2 and a gate of the NMOS access transistor N3 at signal line NS2, respectively, in response to the pull-down control signal DOWNB. The first inverter string is illustrated as including a normally-on transmission gate TG2 and inverters I6 and I7. The second inverter string is illustrated as including an odd number of inverters I8, I9 and I10. The transmission gate TG2 and the inverters I6–I10 are configured to provide equivalent signal delays. Accordingly, a leading edge of the active low pull-down control signal DOWNB (i.e., high-to-low edge) will simultaneously cause the lower NMOS supply transistor N2 to turn on and the NMOS access transistor N3 to turn off and thereby isolate the source of the upper NMOS current source N1 from the second turn-off reference voltage NVT.

According to a preferred aspect of the pull-down control circuit 14b, the NMOS access transistor N3 matches the lower NMOS supply transistor N2 in width and length. This matching of the sizes of the NMOS transistors N2 and N3 causes the gate-to-drain capacitance of the NMOS access transistor N3 to match the gate-to-drain capacitance of the lower NMOS supply transistor N2. In this manner, the capacitive couplings between signal lines NS1 and SN and between signal lines NS2 and SN (and the source of the upper NMOS current source transistor N1) automatically cancel each other when the signal lines NS1 and NS2 are simultaneously switched to opposite logic levels by the first and second delay-balanced inverter strings within the pull-down control circuit 14b. This cancellation of the capacitive coupling to the source terminal of the upper NMOS current source transistor N1 operates to minimize the signal swing at this source terminal when the pull-down path is switched on and off and thereby inhibit charge injection from the pull-down control signal DOWNB to the source of the upper NMOS current source transistor N1. In addition, the magnitude of the second turn-off reference voltage NVT can be carefully controlled to optimize pull-down performance. In alternative embodiments, the NMOS access transistor N3 and the NMOS supply transistor N2 may not match each other in size. Such intentional mismatch may be advantageous to optimize performance for a particular fabrication process, for example.

Figure 3:
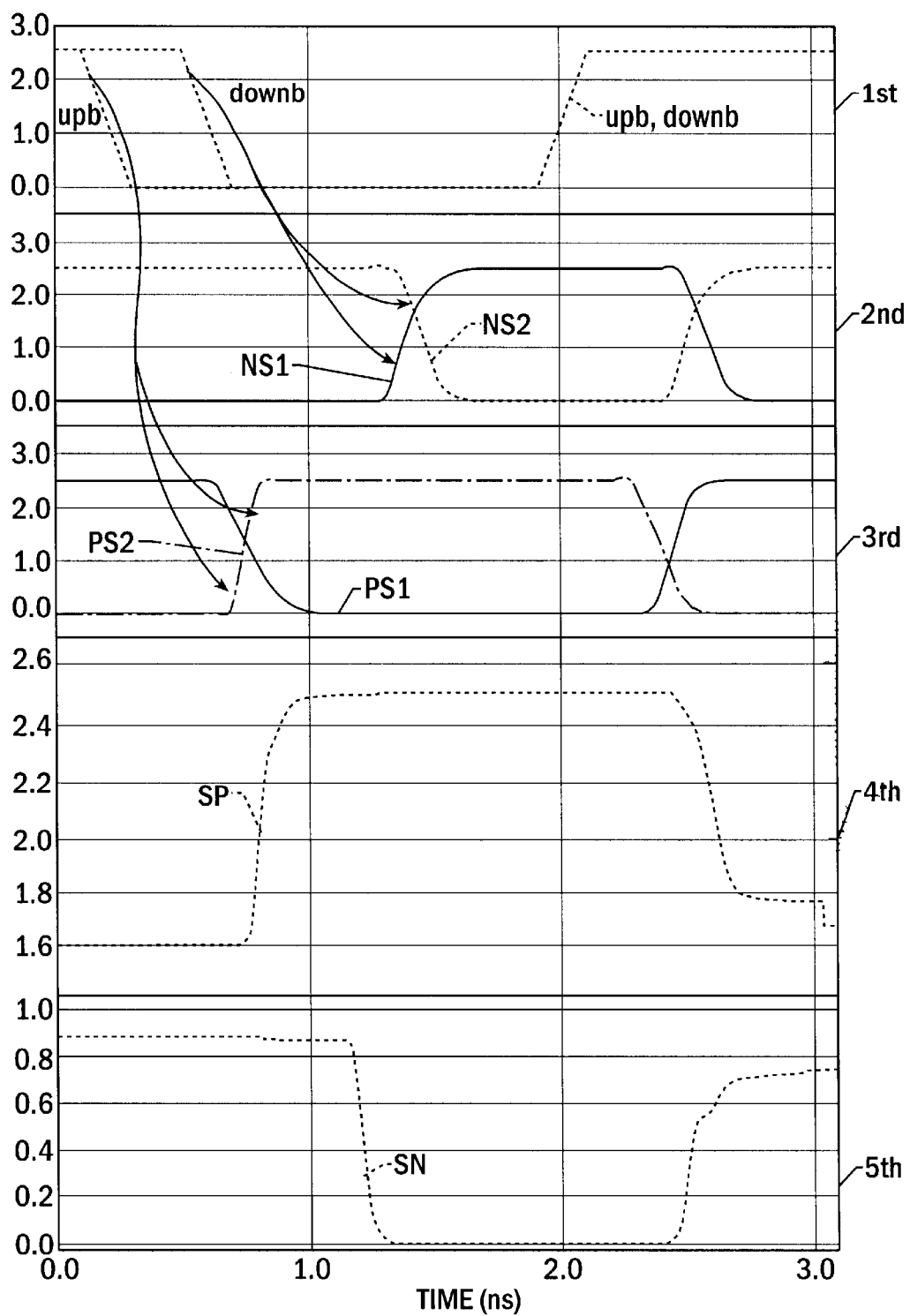
FIG. 3 are timing diagrams that illustrate operation of the charge pump of FIG. 2 when a power supply voltage (Vdd) of 2.5 volts is used.

Referring now to FIG. 3, a plurality of timing diagrams are provided that illustrate operation of the charge pump 12 of FIG. 2 at a power supply voltage of 2.5 Volts. The voltage levels for signals PVT, NVT, VP1 and NV1 are 1.6, 0.9, 1.7 and 0.8 Volts, respectively. In particular, the first timing diagram illustrates the switching of the active low pull-up control signal UPB and the active low pull-down control signal DOWNB from a high voltage level equal to Vdd to a low voltage level of Vss. The second timing diagram illustrates the synchronous switching of signal lines NS1 and NS2 in response to the pull-down control signal DOWNB. The third timing diagram illustrates the synchronous switching of signal lines PS1 and PS2 in response to the pull-up control signal UPB. The fourth timing diagram illustrates the upward and downward movement of node SP (source of PMOS transistor P1) from between 1.6 Volts and 2.5 volts. This movement of node SP is responsive to the switching of signal lines PS1 and PS2. The fifth timing diagram illustrates the upward and downward movement of node SN (source of NMOS transistor N1) from between 0.9 Volts and 0 volts. This movement of node SN is responsive to the switching of signal lines NS1 and NS2.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit charge pump, comprising:
    an output current source having a totem pole driver therein that comprises:
        at least an upper PMOS supply transistor and a lower PMOS current source transistor disposed in series in a pull-up path extending between an output of the driver and a power supply line; and
        at least an upper NMOS current source transistor and a lower NMOS supply transistor disposed in series in a pull-down path extending between the output of the device and a reference line; and
    a pull-up control circuit that is configured to drive a gate of the upper PMOS supply transistor with a PMOS turn-on voltage in response to a leading edge of a pull-up control signal and is further configured to simultaneously drive a gate of the upper PMOS supply transistor with a PMOS turn-off voltage and a source of the lower PMOS current source transistor with a first turn-off reference voltage that is greater than a voltage of the reference line, in response to a trailing edge of the pull-up control signal, said pull-up control circuit comprising:
        a PMOS access transistor having a first current carrying terminal electrically connected to the source of the lower PMOS current source transistor and a second current carrying that is held at the first turn-off reference voltage;
        a first element having an input that is configured to receive the pull-up control signal and an output that is configured to switch the gate of the upper PMOS supply transistor low-to-high in-sync with the trailing edge of the pull-up control signal; and
        a second element having an input that is configured to receive the pull-up control signal and an output that is configured to switch a gate of the PMOS access transistor high-to-low in-sync with the trailing edge of the pull-up control signal, wherein a delay provided by said second element is balanced with a delay provided by said first element.

2. The charge pump of claim 1, further comprising:
    a pull-down control circuit that is configured to drive a gate of the lower NMOS supply transistor with an NMOS turn-on voltage in response to a leading edge of a pull-down control signal and is further configured to simultaneously drive a gate of the lower NMOS supply transistor with an NMOS turn-off voltage and a source of the upper NMOS current source transistor with a second turn-off reference voltage that is less than a voltage of the power supply line, in response to a trailing edge of the pull-down control signal, said pull-down control circuit comprising:
        an NMOS access transistor having a first current carrying terminal electrically connected to the source of the upper NMOS current source transistor and a second current carrying that is held at the second turn-off reference voltage;
        a third element having an input that is configured to receive the pull-down control signal and an output that is configured to switch the gate of the lower NMOS supply transistor high-to-low in-sync with the trailing edge of the pull-down control signal; and
        a fourth element having an input that is configured to receive the pull-down control signal and an output that is configured to switch a gate of the NMOS access transistor low-to-high in-sync with the trailing edge of the pull-down control signal, wherein a delay provided by said third element is balanced with a delay provided by said fourth element.

3. The charge pump of claim 2, wherein the NMOS access transistor matches the lower NMOS supply transistor in width and length.

4. The charge pump of claim 3, wherein a gate electrode of the upper NMOS current source transistor is held at a second bias voltage.

5. The charge pump of claim 1, wherein the PMOS access transistor matches the upper PMOS supply transistor in width and length.

6. The charge pump of claim 5, wherein a gate electrode of the lower PMOS current source transistor is held at a first bias voltage.

7. The charge pump of claim 1, wherein said first element and said second element comprise first and second delay-balanced inverter strings, respectively.

8. An integrated circuit charge pump, comprising:
    an output current source having a totem pole driver therein that comprises:
        at least an upper PMOS supply transistor and a lower PMOS current source transistor disposed in series in a pull-up path extending between an output of the driver and a power supply line; and
        at least an upper NMOS current source transistor and a lower NMOS supply transistor disposed in series in a pull-down path extending between the output of the device and a reference line; and
    a pull-up control circuit that is configured to drive a gate of the upper PMOS supply transistor with a PMOS turn-on voltage in response to a leading edge of a pull-up control signal and is further configured to simultaneously drive a gate of the upper PMOS supply transistor with a PMOS turn-off voltage and a source of the lower PMOS current source transistor with a first turn-off reference voltage that is greater than a voltage of the reference line, in response to a trailing edge of the pull-up control signal;
    wherein said pull-up control circuit comprises a first output that is electrically coupled to the gate of the upper PMOS supply transistor and a second output that is electrically coupled to a source of the lower PMOS current source transistor;
    wherein said pull-up control circuit comprises a PMOS access transistor having a first current carrying terminal electrically coupled to the source of the lower PMOS current source transistor and a second current carrying terminal that is held at the first turn-off reference voltage; and
    wherein said pull-up control circuit further comprises first and second delay-balanced inverter strings that are configured to drive the gate of the upper PMOS supply transistor and a gate of the PMOS access-transistor, respectively, in response to the pull-up control-signal.

9. The charge pump of claim 8, wherein the first and second delay-balanced inverter strings drive the gate of the upper PMOS supply transistor and the gate of the PMOS access transistor with complementary signals.

10. An integrated circuit charge pump, comprising:

an output current source having a totem pole driver therein that comprises at least an upper PMOS supply transistor and a lower PMOS current source transistor disposed in series in a pull-up path extending between an output of the driver and a power supply line; and a pull-up control circuit that is configured to drive a gate of the upper PMOS supply transistor with a PMOS turn-on voltage in response to a leading edge of a pull-up control signal and is further configured to simultaneously drive a gate of the upper PMOS supply transistor with a PMOS turn-off voltage and a source of the lower PMOS current source transistor with a first non-zero turn-off reference voltage in response to a trailing edge of the pull-up control signal;

wherein said pull-up control circuit comprises a PMOS access transistor having a first current carrying terminal electrically coupled to the source of the lower PMOS current source transistor and a second current carrying terminal that is held at the first turn-off reference voltage; and wherein said pull-up control circuit further comprises first and second delay-balanced inverter strings that are configured to drive the gate of the upper PMOS supply transistor and a gate of the PMOS access transistor, respectively, in response to the pull-up control signal.

11. The charge pump of claim 10, wherein the PMOS access transistor matches the upper PMOS supply transistor in width and length.

12. The charge pump of claim 11, wherein a gate electrode of the lower PMOS current source transistor is held at a first bias voltage.

13. An integrated circuit device, comprising:

a driver device that includes at least an upper PMOS supply transistor and a lower PMOS current source transistor disposed in series in a pull-up path extending between an output of the device and a power supply line;

a PMOS access transistor having a first current carrying terminal electrically coupled to a source of the lower PMOS current source transistor and a second current carrying terminal that is held at a first non-zero turn-off reference voltage; and first and second delay-balanced inverter strings that are configured to drive a gate of the upper PMOS supply transistor and a gate of the PMOS access transistor, respectively, in response to a pull-up control signal.

14. The device of claim 13, wherein a drain of the upper PMOS supply transistor is electrically connected to the source of the lower PMOS current source transistor.

15. The device of claim 14, wherein the PMOS access transistor matches the upper PMOS supply transistor in width and length.

16. The charge pump of claim 13, wherein said first and second delay-balanced inverter strings drive the gate of the upper PMOS supply transistor and the gate of the PMOS access transistor with complementary signals.

17. The charge pump of claim 13, wherein a gate electrode of the lower PMOS current source transistor is held at a first bias voltage.

18. An integrated circuit device, comprising:

a driver device that includes at least an upper NMOS current source transistor and a lower NMOS supply transistor disposed in series in a pull-down path extending between an output of the device and a reference line;

an NMOS access transistor having a first current carrying terminal electrically coupled to a source of the upper NMOS current source transistor and a second current carrying terminal that is held at a turn-off reference voltage; and first and second delay-balanced inverter strings that are configured to drive a gate of the lower NMOS supply transistor and a gate of the NMOS access transistor, respectively, in response to a pull-down control signal.

19. The device of claim 18, wherein a drain of the lower NMOS supply transistor is electrically connected to a source of the upper NMOS current source transistor.

20. The device of claim 19, wherein the NMOS access transistor matches the lower NMOS supply transistor in width and length.

21. The charge pump of claim 18, wherein said first and second delay-balanced inverter strings drive the gate of the lower NMOS supply transistor and the gate of the NMOS access transistor with complementary signals.

22. The charge pump of claim 18, wherein a gate electrode of the upper NMOS current source transistor is held at a fixed bias voltage.

23. The charge pump of claim 18, wherein said driver device is electrically coupled to a power supply line; and wherein the turn-off reference voltage is less than a voltage of the power supply line.

24. An integrated circuit device, comprising:

a driver device that comprises at least an upper PMOS supply transistor and a lower PMOS current source transistor disposed in series in a pull-up path extending between an output of the device and a power supply line;

a PMOS access transistor having a first current carrying terminal electrically coupled to a source of the lower PMOS current source transistor and a second current carrying terminal that is configured to receive a first non-zero turn-off reference voltage; and first and second delay-balanced elements that are configured to drive a gate of the upper PMOS supply transistor and a gate of the PMOS access transistor with first and second complementary signals, respectively, in response to a pull-up control signal.

25. The device of claim 24, wherein said first and second delay-balanced elements comprise first and second delay-balanced inverter strings.

26. The device of claim 24, wherein said first and second delay-balanced elements are configured to drive the gate of the upper PMOS supply transistor with a first low-to-high turn-off signal and also drive the gate of the PMOS access transistor with a first high-to-low turn-on signal, in-sync with a trailing edge of the pull-up control signal.

27. The device of claim 26, wherein the delays provided by said first and second delay-balanced elements are sufficiently balanced that each rising edge of the first low-to-high turn-off signal is aligned with a corresponding falling edge of the first high-to-low turn-on signal.

28. The device of claim 25, wherein said first and second delay-balanced elements are configured to drive the gate of the upper PMOS supply transistor with a first low-to-high turn-off signal and also drive the gate of the PMOS access transistor with a first high-to-low turn-on signal, in-sync with a trailing edge of the pull-up control signal.

29. The device of claim 28, wherein the delays provided by said first and second delay-balanced elements are sufficiently balanced that each rising edge of the first low-to-high turn-off signal is aligned with a corresponding falling edge of the first high-to-low turn-on signal.

30. The device of claim 27, wherein said driver device further comprises at least an upper NMOS current source transistor and a lower NMOS supply transistor disposed in series in a pull-down path extending between the output of the device and a reference line;

an NMOS access transistor having a first current carrying terminal electrically coupled to a source of the upper NMOS current source transistor and a second current carrying terminal that is held at a turn-off reference voltage; and third and fourth delay-balanced elements that are configured to drive a gate of the lower NMOS supply transistor and a gate of the NMOS access transistor with third and fourth complementary signals, respectively, in response to a pull-down control signal.

31. The device of claim 30, wherein the lower NMOS supply transistor matches the NMOS access transistor in width and length; and wherein the upper PMOS supply transistor matches the PMOS access transistor in width and length.

32. The device of claim 30, wherein each of said first and fourth elements comprises a respective transmission gate.

* * * * *